United States Patent
Ding et al.

(10) Patent No.: US 11,742,284 B2
(45) Date of Patent: Aug. 29, 2023

(54) INTERCONNECT STRUCTURE FABRICATED USING LITHOGRAPHIC AND DEPOSITION PROCESSES

(71) Applicant: Intel Corporation, Santa Clara, CA (US)

(72) Inventors: Zhicheng Ding, Shanghai (CN); Bin Liu, Shanghai (CN); Yong She, Shanghai (CN); Zhijun Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/053,144

(22) PCT Filed: Dec. 12, 2018

(86) PCT No.: PCT/CN2018/120572
§ 371 (c)(1),
(2) Date: Nov. 5, 2020

(87) PCT Pub. No.: WO2020/118558
PCT Pub. Date: Jun. 18, 2020

(65) Prior Publication Data
US 2021/0057326 A1     Feb. 25, 2021

(51) Int. Cl.
*H01L 23/525*   (2006.01)
*H01L 25/065*   (2023.01)
*H01L 23/00*    (2006.01)

(52) U.S. Cl.
CPC ............ *H01L 23/525* (2013.01); *H01L 24/48* (2013.01); *H01L 25/0657* (2013.01); *H01L 2924/15311* (2013.01)

(58) Field of Classification Search
CPC ... H01L 23/525; H01L 24/48; H01L 25/0657; H01L 2924/15311; H10B 80/10
See application file for complete search history.

(56) References Cited

U.S. PATENT DOCUMENTS

| 7,595,222 B2* | 9/2009 | Shimoishizaka ... H01L 29/0657 257/E25.015 |
| 2009/0160065 A1* | 6/2009 | Haba ...................... H01L 24/97 438/109 |

(Continued)

FOREIGN PATENT DOCUMENTS

WO   WO-2008154255   12/2008

OTHER PUBLICATIONS

International Search Report and Written Opinion for International Patent Application No. PCT/CN2018/120572 dated Sep. 19, 2019, 9 pgs.

*Primary Examiner* — Timor Karimy
(74) *Attorney, Agent, or Firm* — Schwabe, Williamson & Wyatt, P.C.

(57) ABSTRACT

Embodiments described herein provide techniques of forming an interconnect structure using lithographic and deposition processes. The interconnect structure can be used to couple components of a semiconductor package. For one example, a semiconductor package includes a die stack and an interconnect structure formed on the die stack. The die stack comprises a plurality of dies. Each die in the die stack comprises: a first surface; a second surface opposite the first surface; sidewall surfaces coupling the first surface to the second surface; and a pad on the first surface. A one sidewall surface of one of the dies has a sloped profile. The semiconductor package also includes an interconnect structure positioned on the first surfaces and the sidewall with the sloped profile. In this semiconductor package, the interconnect structure electrically couples the pad on each of the dies to each other.

22 Claims, 11 Drawing Sheets

(56) References Cited

U.S. PATENT DOCUMENTS

| | | | |
|---|---|---|---|
| 2010/0140811 A1* | 6/2010 | Leal | H01L 24/24 |
| | | | 257/777 |
| 2010/0193930 A1* | 8/2010 | Lee | H01L 23/5389 |
| | | | 257/686 |
| 2018/0337161 A1 | 11/2018 | Yan et al. | |
| 2019/0181096 A1* | 6/2019 | Wu | H01L 21/561 |

* cited by examiner

INTERCONNECT STRUCTURE FABRICATED USING LITHOGRAPHIC AND DEPOSITION PROCESSES

CROSS-REFERENCE TO RELATED APPLICATION

This patent application is a U.S. National Phase Application under 35 U.S.C. § 371 of International Application No. PCT/CN2018/120572, filed Dec. 12, 2018, entitled "INTERCONNECT STRUCTURE FABRICATED USING LITHOGRAPHIC AND DEPOSITION PROCESSES," which designates the United States of America, the entire disclosure of which is hereby incorporated by reference in its entirety and for all purposes.

BACKGROUND

Field

Embodiments described herein generally relate to semiconductor packages. More particularly, but not exclusively, embodiments described herein relate to using lithographic and deposition processes to form an interconnect structure that electrically couples components of a semiconductor package.

Background Information

Currently, interconnections between components of a semiconductor package are achieved using interconnects. Examples of such interconnects include, but are not limited to, wire bonds, redistribution layers (RDLs), interposer substrates, and through-silicon vias (TSVs). Pressures to miniaturize electronic devices and improve these devices' performance (e.g., processing power, etc.) has led to increased pressure to reduce sizes of semiconductor packages and increase input/output (I/O or IO) densities of such packages. However, interconnects between components of semiconductor packages present challenges to reducing sizes of semiconductor packages, especially in the realm of three dimensional (3D) packaging.

As used herein, a 3D package and its variations refer to a semiconductor package that contains a die stack—that is, two or more dies that are vertically stacked on each other. This architecture is beneficial because the dies in the die stack occupy less space (in the X-Y plane), have greater connectivity, and can be used for high speed applications. 3D packages can be classified according to the interconnections between dies in a die stack. One type of 3D package, as defined by interconnects in a die stack, is an edge-wired 3D package.

In edge-wired 3D packages, the dies in a die stack are wired together using wire bonds along the dies' edges. The wire bonds increase the size (e.g., z-height, etc.) of the edge-wired 3D package. Additionally, an interposer substrate may be required to couple the wire bonds to each other, which can also increase the size of the edge-wired 3D package. Furthermore, even though wire bonds offer flexibility that makes them usable in different semiconductor architectures, there is a lack of standardization of wire sizes (e.g., length, diameter, spacing between wires, etc.). This lack of standardization causes variance across wires, which can in turn create noise that affects signal propagation between electrical components in a semiconductor package. Such noise can prevent use of wire bonding technology in high speed applications.

Edge-wired 3D packages suffer from several drawbacks, as described above. Consequently, interconnects for electrically coupling components of semiconductor packages remain suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
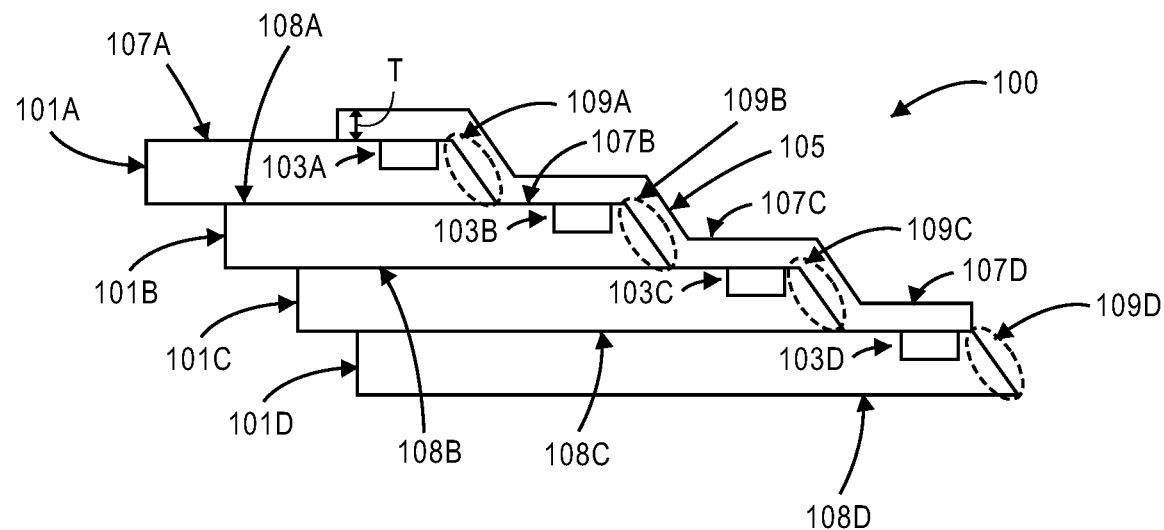
FIGS. 1A-1B illustrate cross-sectional side and plan views of a die stack comprising an interconnect structure fabricated thereon, according to one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Orientation terminology, such as "horizontal," as used herein is defined with respect to a plane parallel to the conventional plane or surface of a die or substrate, regardless of the orientation of the die or substrate. The term "vertical" refers to a direction perpendicular to the horizontal as defined above. Such terminology may include the words specifically mentioned above, derivatives thereof, and words of similar import.

Embodiments described herein provide techniques of fabricating an interconnect structure using lithographic and deposition processes. An examples of a lithography technique is photolithography. Examples of deposition techniques include physical vapor deposition (PVD), electrochemical deposition (ECD), etc. Embodiments of the interconnect structure described herein are used for electrically coupling at least two components in a semiconductor package.

Several advantages are attributable to embodiments of the interconnect structure described herein. One advantage is that the interconnect structure can assist with reducing sizes (e.g., z-heights, etc.) of semiconductor packages. This is because the interconnect structure does not require the use of wire bonds, which extend upwards in the Z-direction. Instead, the interconnect structures described herein are conformal to the surfaces of the stacked dies. Another advantage is that interconnect structures can enable semiconductor packages to be used in high speed applications. This is because the interconnect is formed as a single structure, which means there is no variance in the interconnect's structure that can create unwanted noise. Yet another advantage is that fabricating the interconnect structures is less costly and less complex than fabricating wire bonds, which can in turn improve the yield and reliability of semiconductor packages comprising embodiments of the interconnect structures described herein. As shown above, fabricating interconnect structures in accordance with the embodiments described herein can assist with reducing costs associated with semiconductor packaging and manufacturing, reducing sizes (e.g., z-heights, etc.) of packages, and enabling packages to be used in high speed applications. Other advantages are described below in connection with one or more of FIGS. 1A-7.

In one embodiment, an interconnect structure that is formed in accordance with one or more of the embodiments described herein electrically couples one or more of the following: (i) at least two dies in a die stack to each other; and (ii) a die stack to another electrical component (e.g., a redistribution layer (RDL), a conductive trace, a pad, an inductor, a capacitor, etc.). An interconnect structure that is formed in accordance with one or more of the embodiments described herein can be fabricated from copper or any other electrically conductive material or any combination of electrically conductive materials known in the art. In one embodiment, at least one sidewall of a die has a sloped profile. For brevity, a sidewall of a die that has a sloped profile may be referred to as a sloped sidewall herein. When two or more such dies are stacked on top of each other, the presence of a sloped sidewall allows for interconnect structures to be made between the surfaces of the dies without the need for wire bonding. Particularly, a continuous trace of conductive material may be deposited over a surface of a first die, along the sloped sidewall of the second die, and over a surface of a second die below the first die. Such a continuous trace is not possible without a sloped sidewall, because deposition of a conductive material (e.g., using PVD, ECD, or the like) is not possible along a vertical sidewall surface. In another embodiment, an electrical component (e.g., a redistribution layer (RDL), a conductive trace, a pad, an inductor, a capacitor, etc.) is fabricated or deposited on an interconnect structure that is formed in accordance with one or more of the embodiments described herein. In this embodiment, the interconnect structure electrically couples the electrical component to a die stack.

Figure 1B:
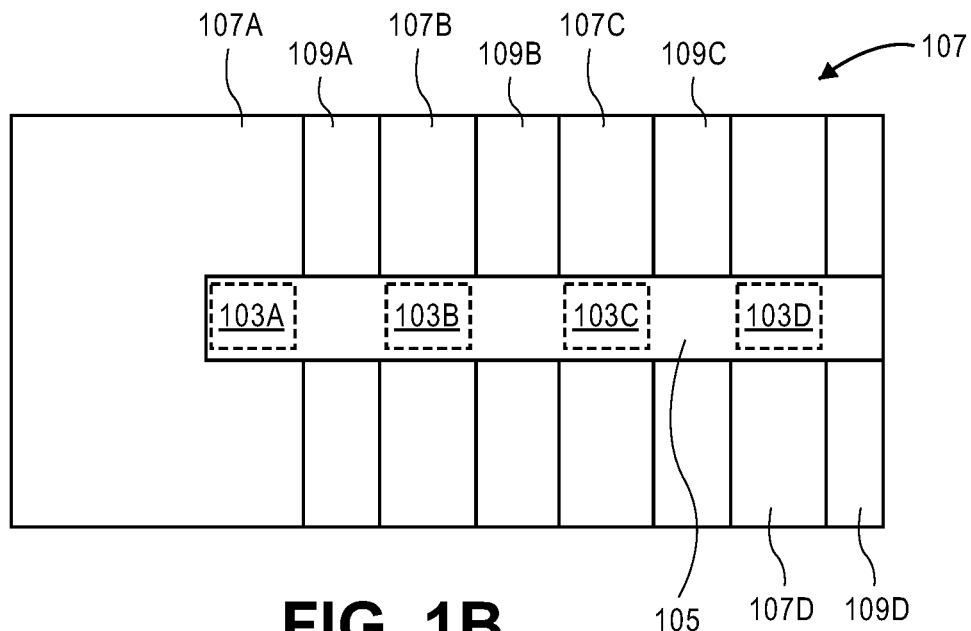

FIGS. 1A-1B illustrate cross-sectional side and plan views 100, 107 of a die stack having an interconnect structure 105 fabricated thereon, according to one embodiment. With regard now to FIG. 1A, a cross-sectional side view 100 of a die stack comprising dies 101A-D and an interconnect structure 105 formed on the die stack is shown. The dies 101A-D may be coupled to each other using an adhesive (e.g., a die attach film (DAF), etc.), as exemplified in FIGS. 2A-B. Alternatively, or additionally, the dies 101A-D may be coupled to each other using any known bonding technique or combination of known bonding techniques or any other suitable coupling technique or combination of suitable coupling techniques known in the art.

In one embodiment, the dies 101A-D have pads 103A-D formed thereon or therein, respectively. Each of pads 103A-D is a conductive contact that is formed on or in a respective one of dies 101A-D. As shown in FIG. 1A, each of the dies 101A-D includes at least one sidewall that has a sloped profile—that is, a sloped sidewall. For example, and as shown in FIG. 1A, the die 101A has a sloped sidewall 109A, the die 101B has a sloped sidewall 109B, the die 101C has a sloped sidewall 109C, and the die 101D has a sloped sidewall 109D. The sloped sidewall 109 of each die 101 couples a first surface 107 of a die 101 to a second surface 108 of a die 101. For example, the sloped sidewall 109A couples a first surface 107A of die 101A to a second surface 108A of die 101A. In an embodiment, the stacked dies 101A-D may be stacked in an offset configurations. An offset configuration allows for at least a portion of the first surface 107 of each die 101 to be exposed. In one embodiment, the sloped sidewalls 109A-D may be formed in accordance with description provided below in connection with FIGS. 2A-2C. In one embodiment, the slope of each of the sidewalls 109A-D is formed at an angle that ranges from 30 degrees to 60 degrees relative to the surfaces 108A-D, respectively. For example, the sidewall surface 109A having the sloped profile is coupled to the second surface 108A of the die 101A at an angle that ranges from 30 degrees to 45 degrees. It is to be appreciated that the slope of the sidewalls 109A-D may differ from each other or may be the same as each other. For example, the slope of sidewall 109A may have an angle that differs from the angle of the slope of the sidewall 109B. For another example, the slopes of the sidewalls 109A-D all have the same angle. Even though each of the dies 101A-D is shown as having a single sloped sidewall, other embodiments are not so limited. For example, at least one of the dies 101A-D may include two or more sloped sidewalls. In one embodiment, the sloped sidewalls 109A-C provide a non-vertical transition from the first surface 107 of a first die 101 to a first surface 107 of an underlying die 101. For example, the sloped sidewall 109A provides a non-vertical transition from the first surface 107A of the first die 101A to the first surface 107B of the underlying second die 101B.

With regard again to FIG. 1A, an interconnect structure 105 that is fabricated on the dies 101A-D is shown. In one embodiment, and as shown in FIG. 1A, the interconnect structure 105 is formed as a single continuous structure that conforms to the sidewalls 109A-C and the exposed first surfaces 107A-D of the dies 101A-D that have the pads 103A-D formed therein or thereon. Consequently, wire bonds are not required to couple the pads 103A-D of the dies 101A-D to each other. Furthermore, the issue of variance (e.g., variance in length, variance in diameter, variance in spacing, etc.) that plagues wire bonds is minimized or eliminated since the dimensions of the interconnect structure 105 are defined lithographically. As a result, the interconnect structure 105 can enable a semiconductor package that includes the die stack shown in FIG. 1A to be used in high speed applications, where noise tolerance is minimal or non-existent.

The thickness T of the interconnect structure 105, which is relatively smaller than the height in the z-direction of a wire that is bonded to a pad, can assist with reducing sizes (e.g., z-heights, etc.) of semiconductor packages. In one embodiment, the interconnect structure 105 has a thickness that ranges from 0.5 µm to 5.0 µm.

Wire bonding technology requires bonding a wire to a pad. One drawback of this bonding process is the tendency of pads to peel or crack during welding. Such defects may adversely affect processing yields and/or the reliability of semiconductor packages. In contrast, the interconnect structure 105 is formed as a single structure using lithographic patterning and deposition processes (e.g., PVD, ECD, etc.). Consequently, the need for welding is eliminated. As a result, the tendency of pads to peel or crack is reduced or eliminated. More specifically, the use of lithographic patterning and deposition processes to fabricate the interconnect structure 105 on the pads 103A-D minimizes or eliminates the tendency of pads to peel or crack because there is no need to bond a wire to any one of the pads 103A-D. Thus, fabricating the interconnect structure 105 using lithographic and deposition processes may assist with increasing the processing yields and/or the reliability of semiconductor packages that include the die stack shown in FIG. 1A.

Moving on to FIG. 1B, a plan view 107 of the die stack shown in FIG. 1A is illustrated. As shown, the interconnect structure 105 is a continuous structure that conforms to the surfaces of the stacked dies. For example, the interconnect structure 105 extends over a first surface 107A of the first die 101A, extends down over the sloped sidewall 109A to a first surface 107B of the second die 101B, along the first surface 107B of the second die 101B, extends down over the sloped sidewall 109B to a first surface 107C of the third die 101C, along the first surface 107C of the third die 101C, extends down over the sloped sidewall 109C to a first surface 107D of the fourth die 101D, and over the first surface of the fourth die 101D. While four stacked dies 101A-D are shown, it is to be appreciated that any number of dies (e.g., two or more) may be stacked and electrically coupled to each other with a continuous conformal interconnect structure 105 in accordance with embodiments disclosed herein. As indicated by the dashed lines, the pads 103A-D are underneath the interconnect structure 105. It is to be appreciated that, even though only one interconnect structure 105 is shown in the embodiment illustrated in FIGS. 1A-B, other embodiments are not so limited. Specifically, other embodiments may include one or more interconnect structures coupling two or more components (e.g., dies, traces, pads, inductors, capacitors, etc.) to each other, where each of the one or more interconnect structures is similar to or the same as the interconnect structure 105. For example, a die stack has multiple interconnect structures that are similar to or the same as the interconnect structure 105 formed thereon. For this example, each of the interconnect structures couples two or more pads to each other.

Figure 2A:
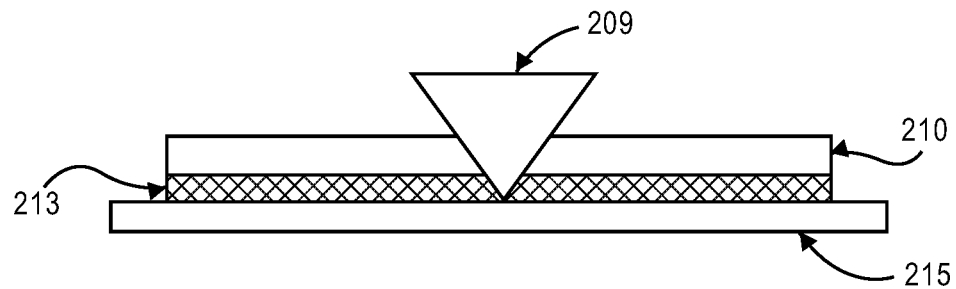
FIGS. 2A-2C illustrate cross-sectional side views of a method of fabricating a die with at least one sidewall that has a sloped profile, according to one embodiment.
Figure 2B:
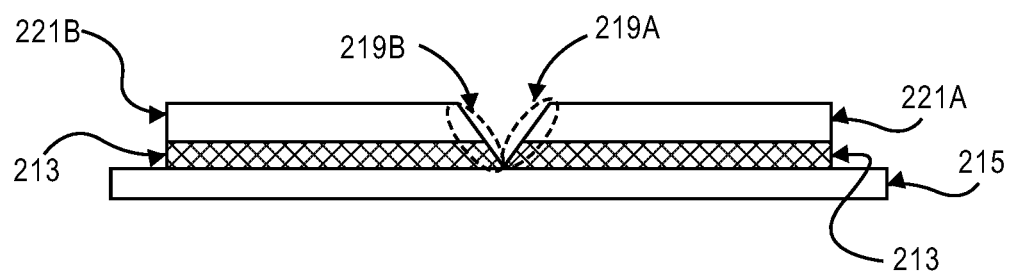
Figure 2C:
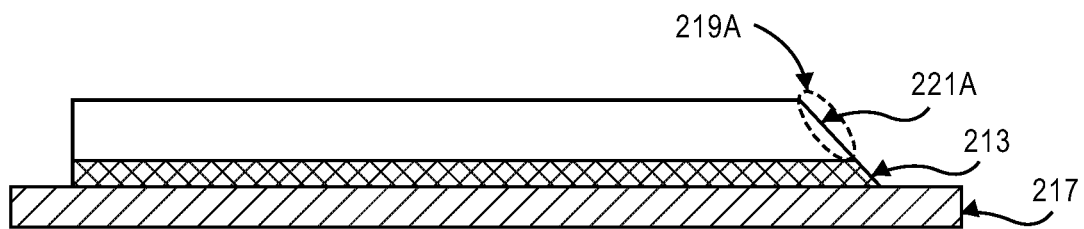

FIGS. 2A-2C illustrate cross-sectional side views of a method of fabricating a die 211 with at least one sidewall 219 that has a sloped profile, according to one embodiment. With regard now to FIG. 2A, a wafer 210 is on a surface of a support substrate 215. The wafer 210 can be formed from silicon, gallium arsenide, glass, quartz, or any other suitable material or combination of suitable materials known in the art. A die attach film (DAF) 213 physically couples the wafer 210 to the surface of the support substrate 215. Next, and as shown in FIG. 2A, a V-shaped saw blade 209 dices a portion of the wafer 210 (e.g., along a scribe line) in order to singulate die 221A from die 221B. FIG. 2B illustrates each of the singulated dies 221A-B coupled to the support substrate 215 by DAF 213. Due to the V-shaped profile of the saw blade 209, the dies 221A-B include sloped sidewalls 219A-B, respectively. That is, the die 221A includes a sloped sidewall 219A and the die 221B includes a sloped sidewall 219B. The slope of each of the sidewalls 219A-B is formed using an angle that ranges from 30 degrees to 60 degrees relative to a surface of the support substrate 215 or relative to a surface of the wafer 210. Furthermore, the DAF 213 has at least one sidewall with a sloped profile that matches the sloped profiles of the sidewall surfaces 219A-B. For example, and as shown in FIG. 2B, the DAF 213 under the die 221A has a sidewall with a sloped profile that matches the sloped profile of the die 221A's sidewall 219A. For another example, and as shown in FIG. 2B, the DAF 213 under the die 221B has a sidewall with a sloped profile that matches the sloped profile of the die 221B's sidewall 219B. Even though each of the dies 221A-B and the DAF 213 under the dies 221A-B is shown as having a single sloped sidewall, other embodiments are not so limited. For example, when the V-shaped saw blade 209 is used to dice more than one edge of the die, the dies 221A-B and/or the DAF 213 under the dies 221A-B may include two or more sloped sidewalls.

Moving on to FIG. 2C, the die 221A is transferred, using a pick and place machine, onto a carrier 217. The carrier 217 can be formed from silicon, glass, or any other suitable material or combination of suitable materials known in the art. As shown in FIG. 2C, the DAF 213 couples the die 221A to the carrier 217. It is to be appreciated that the die 221B may also be transferred onto a different carrier or be stacked onto die 221A. This transfer is not shown for brevity.

Figure 3:
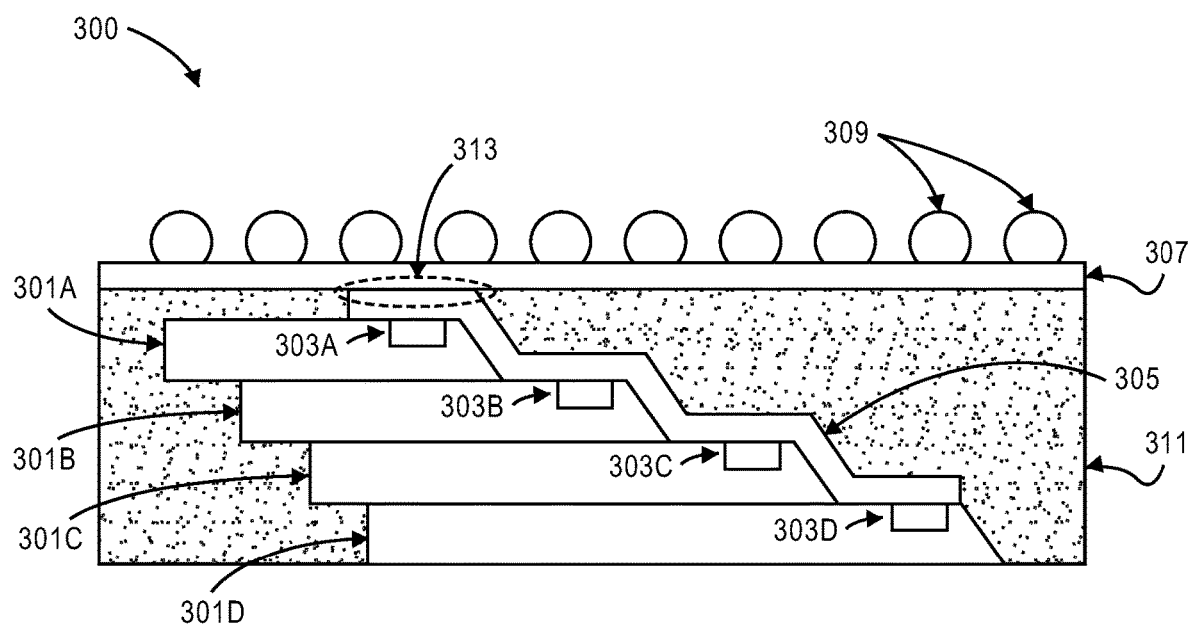
FIG. 3 illustrates a cross-sectional side view of a semiconductor package comprising an interconnect structure fabricated using lithographic and deposition processes, according to one embodiment.

FIG. 3 illustrates a cross-sectional side view of a semiconductor package 300 comprising a continuous and conformal interconnect structure 305 fabricated using lithographic and deposition processes, according to one embodiment. In an embodiment, the semiconductor package 300 comprises: (i) a die stack comprising dies 301A-D; (ii) an interconnect structure 305; (iii) a molding compound 311; (iv) an RDL 307; and (v) a plurality of solder bumps 309 on the RDL 307.

In an embodiment, the semiconductor package 300 comprises a die stack that includes dies 301A-D. Each of dies 301A-D includes a pad formed thereon or therein. Specifically, the die 301A has a pad 303A formed therein or thereon, the die 301B has a pad 303B formed therein or thereon, the die 301C has a pad 303C formed therein or thereon, and the die 301D has a pad 303D formed therein or thereon. Furthermore, each of the dies 301A-D includes a sloped sidewall. In an embodiment, the dies 301A-D in the die stack may be substantially similar to dies 101A-D in the die stack 100 described above with respect to FIG. 1A.

In an embodiment, an interconnect structure 305 is formed on the dies 301A-D. In one embodiment, the interconnect structure 305 conforms to the sloped sidewalls and to the first surfaces of the dies 301A-D having the pads 303A-D formed thereon or therein. The interconnect structure 305 is formed using a lithographic patterning process and a deposition process (e.g., PVD, ECD, any other suitable deposition process or combination of deposition techniques known in the art, etc.), as described below in connection with FIGS. 4A-5J. In an embodiment, the interconnect structure 305 may be substantially similar to the interconnect structure 105 described above with respect to FIG. 1A.

In an embodiment, a molding compound 311 encapsulates the dies 301A-D and the interconnect structure 305. As used herein, the term "encapsulating" and its variations do not require all sides of a component to be encapsulated. For example, and as shown in FIG. 3, a surface 313 of the interconnect structure 305 is not encapsulated by the molding compound, even though all other portions of the interconnect structure 305 are encapsulated by the molding compound 311. In an embodiment, plastic (e.g., epoxy resin, etc.) can be used to form the molding compound 311.

In an embodiment, the semiconductor package 300 includes an RDL 307 formed on the molding compound 311 and the exposed surface 313 of the interconnect structure 305. The RDL 307 comprises at least one metal layer (not shown) that makes the pads of dies 301A-D, via the interconnect structure 305, available in other locations of the semiconductor package 300.

In an embodiment, a plurality of solder bumps 309 are formed on the RDL 307. While solder bumps are particularly illustrated in FIG. 3, it is to be appreciated that other architectures such as, bumps, micro-bumps, columns, or any other suitable interconnect architecture or combination of interconnect architectures known in the art may be used. The solder bumps 309 (or any other interconnect architecture) may be formed from solder, gold, conductive epoxy, copper, or any other suitable material or combination of suitable materials known in the art.

FIGS. 4A-4I illustrate cross-sectional side views of a method of forming a semiconductor package 400 comprising a conformal and continuous interconnect structure 411 fabricated using lithographic and deposition processes, according to one embodiment. With regard now to FIG. 4A, a die stack comprising dies 403A-B is deposited on a carrier 401. The dies 403A-B include pads 405A-B, respectively. Furthermore, the dies 403A-B include sloped sidewalls 409A-B, respectively. The dies 403A-B are offset with regard to each other such that a portion of the die 403B having the pad 405B thereon or therein is exposed. The dies 403A-B can be similar to or the same as any of the dies described above in connection with at least one of FIGS. 1A-3. The pads 405A-B can be similar to or the same as any of the pads described above in connection with at least one of FIGS. 1A-3. The sloped sidewalls 409A-B can be similar to or the same the sloped sidewalls described above in connection with at least one of FIGS. 1A-3.

Figure 4A:
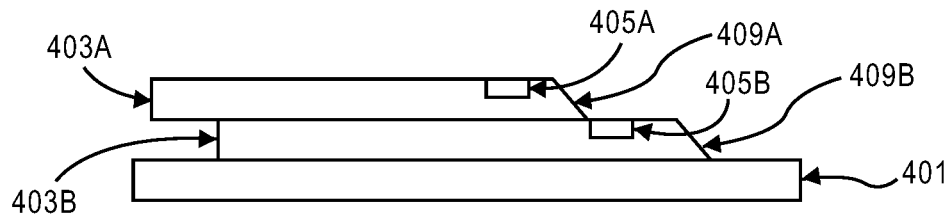
FIGS. 4A-4I illustrate cross-sectional side views of a method of forming a semiconductor package comprising an interconnect structure fabricated using lithographic and deposition processes, according to one embodiment.
Figure 4B:
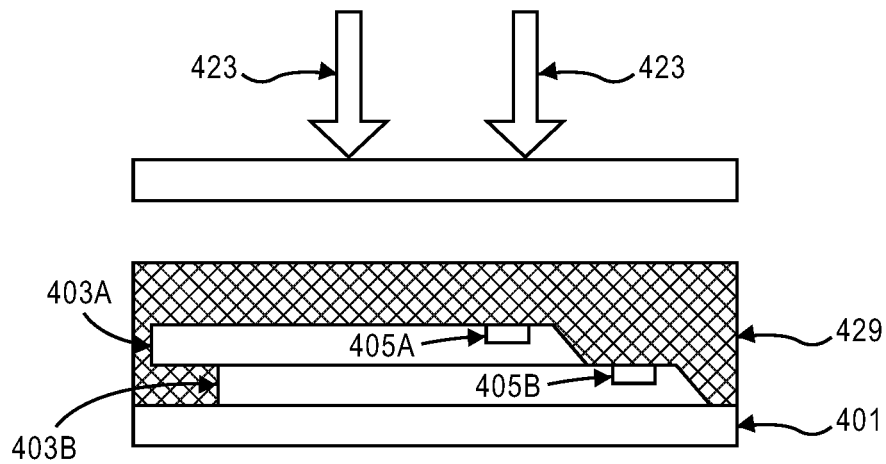
Figure 4C:
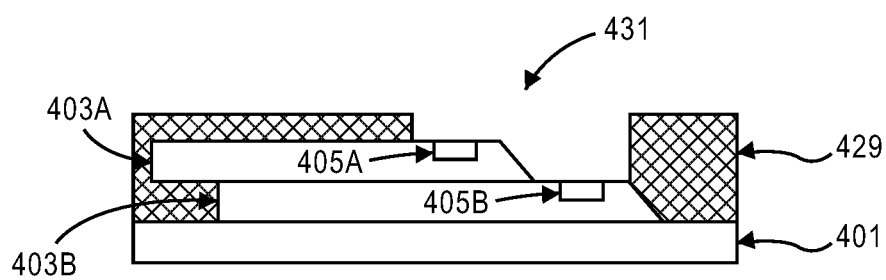

Next, in FIG. 4B, a photoresist 429 is deposited on the dies 405A-B and the carrier 401. More specifically, the photoresist 429 encapsulates the dies 405A-B and the carrier 401. The photoresist 429 can comprise a positive photoresist, a negative photoresist, or a combination thereof. Subsequently, the photoresist 429 is lithographically processed using light 423 and a mask 425. With regard now to FIG. 4C, the (un)exposed portions of the processed photoresist 429 can be removed using a developer to reveal an opening 431. Moving on to FIG. 4D, a deposition process 427 is used to deposit an electrically conductive material 457 (e.g., copper, gold, any other conductive metal or combination of conductive metals, any other suitable conductive material or combination of conductive materials known in the art, etc.) on the processed photoresist 429 and in the opening 431 to form an interconnect structure 411.

Figure 4D:
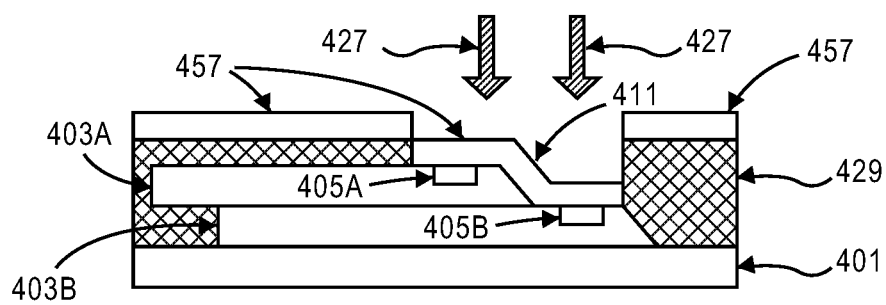

As shown in FIG. 4D, the interconnect structure 411 conforms to the exposed surfaces of the first die 403A and the second die 403B. Particularly, the interconnect structure 411 conforms to the sloped sidewall 409A of the first die to provide a continuous interconnect structure 411 from the top surface of the first die 403A to the top surface of the second die 403B. Due to the profile of the sloped surface 409A, a deposition process may be used to provide a continuous interconnect structure 411 between pads 405A and 405B. In an embodiment, the deposition process used to form the interconnect structure 411 is a non-conformal deposition process that allows for depositing the electrically conductive material 457 on the desired surfaces of dies 403A-B with no voids or spaces between the electrically conductive material 457 and the desired surfaces of dies 403A-B (i.e., the top surface of the first die 403A, the sloped sidewall 409A of the first die, and the top surface of the second die 403B). In this way, the non-conformal deposition process is used to form the interconnect structure 411 as a continuous structure that conforms to the desired surfaces of dies 403A-B and couples the pads 405A-B to each other. In an embodiment, the non-conformal deposition process is a PVD process, an ECD process, any other known non-conformal deposition process, or any combination thereof. Examples of PVD include sputtering and evaporation.

Figure 4E:
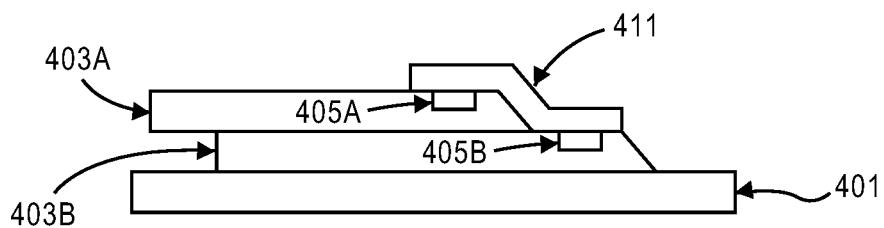
Figure 4F:
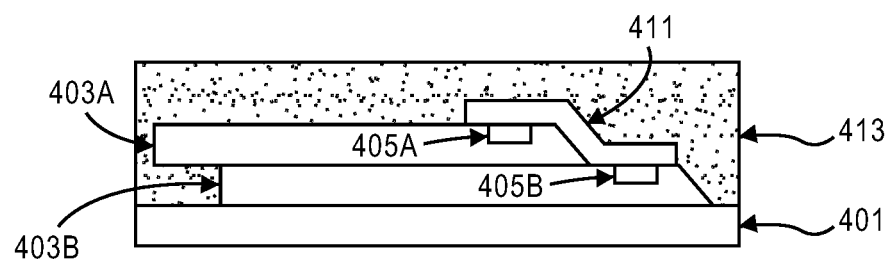
Figure 4G:
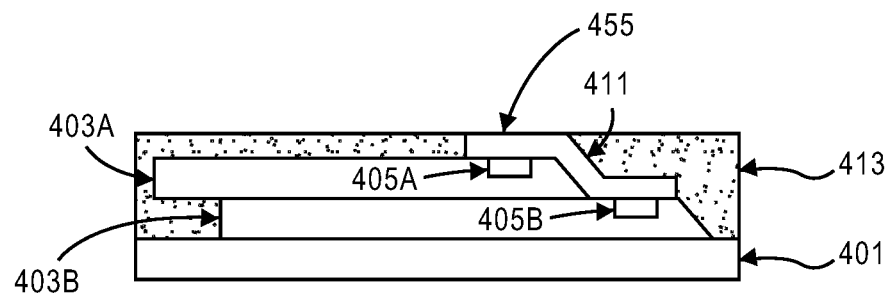

Next, and as shown in FIG. 4E, the remaining portion of the processed photoresist 429 and the electrically conductive material 457 on the processed photoresist 429 may be removed (e.g., with an etching process, an ashing process, a combination of an etching process and an ashing process, etc.) to reveal the interconnect structure 411 as a single structure on the sloped sidewall 409A of the die 403A and the top surfaces of the dies 403A-B comprising the pads 405A-B. In FIG. 4F, a molding compound 413 is used to encapsulate the dies 403A-B and the interconnect structure 411. Next, in FIG. 4G, a grinding technique is used to remove top portions of the molding compound 413 until a topmost surface 455 of the interconnect structure 411 is exposed. Any suitable grinding technique may be used, such as chemical mechanical planarization (CMP).

Figure 4H:
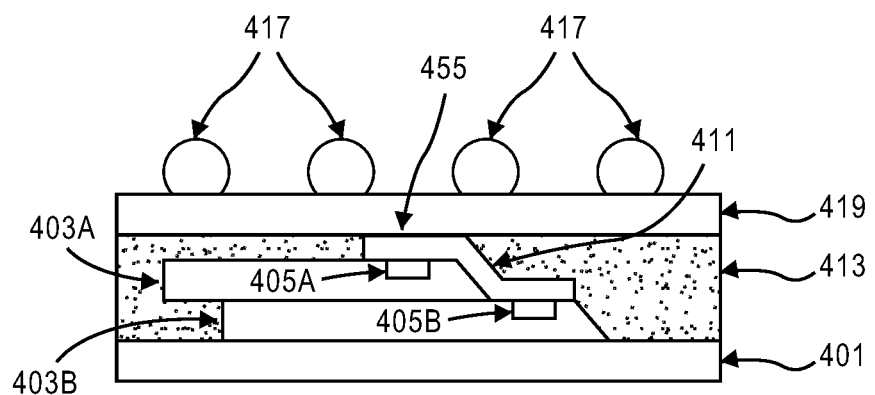

Moving on to FIG. 4H, an RDL 419 may be formed on the molding compound 413 and on the exposed surface 455 of the interconnect structure 411. Any suitable technique known in the art for forming an RDL may be used. The RDL 419 may be similar to or the same as the RDL 307 described above in connection with FIG. 3. Additionally, a plurality of solder bumps 417 (or any other interconnect architecture) may be formed on the RDL 419. The solder bumps 417 may be similar to or the same as the solder bumps 309 described above in connection with FIG. 3.

Figure 4I:
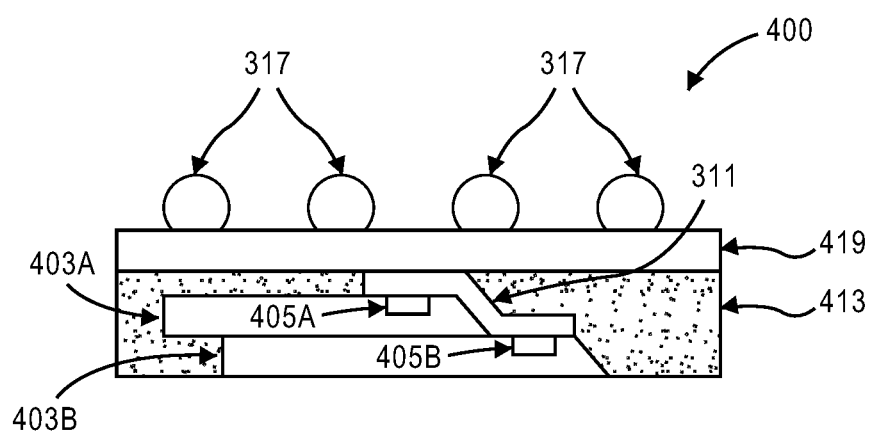

With regard now to FIG. 4I, a semiconductor package 400 is shown. The package 400 is formed after removal of the carrier 401 from the bottom surfaces of the die 405B and the molding compound 413. The package 400 can be similar to or the same as the package 300 described above in connection with FIG. 3.

FIGS. 5A-5J illustrate cross-sectional side views of a method of forming a semiconductor package 500 comprising a conformal and continuous interconnect structure 511, according to another embodiment. The method shown in FIGS. 5A-5E is the same as the method shown in FIGS. 4A-4E. For brevity, only FIGS. 5F-5J are described below.

Figure 5A:
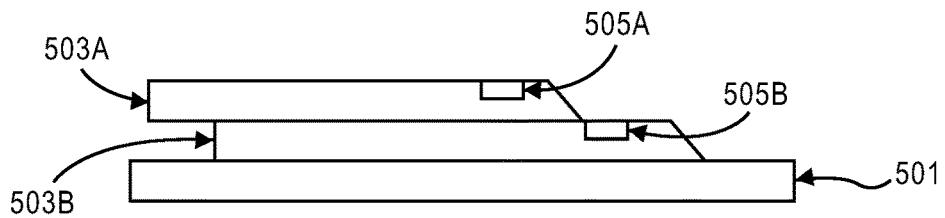
FIGS. 5A-5J illustrate cross-sectional side views of a method of forming a semiconductor package comprising an interconnect structure fabricated using lithographic and deposition processes, according to another embodiment.
Figure 5B:
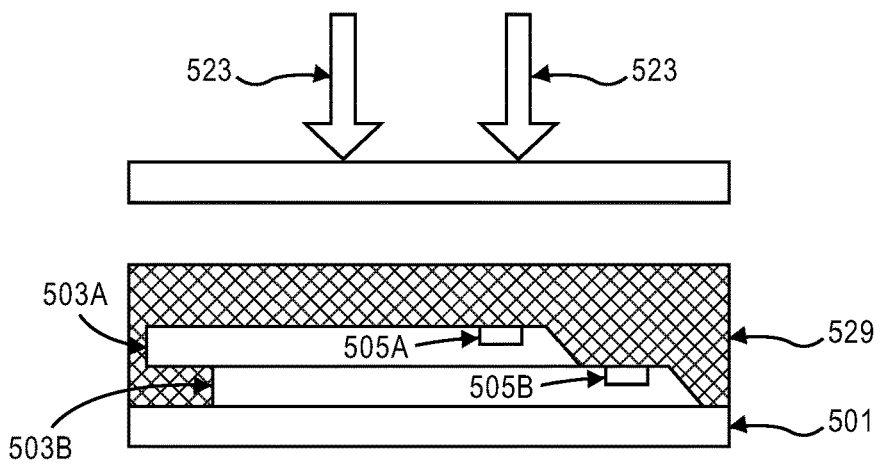
Figure 5C:
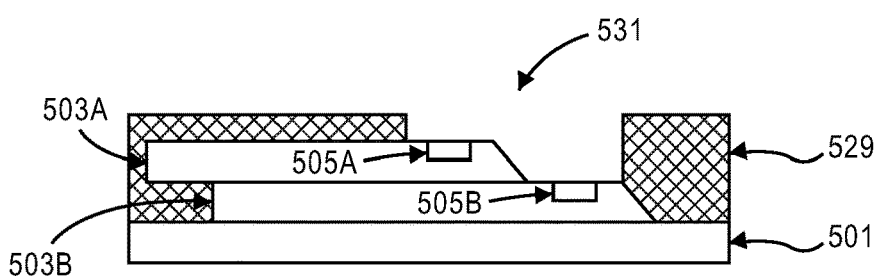
Figure 5D:
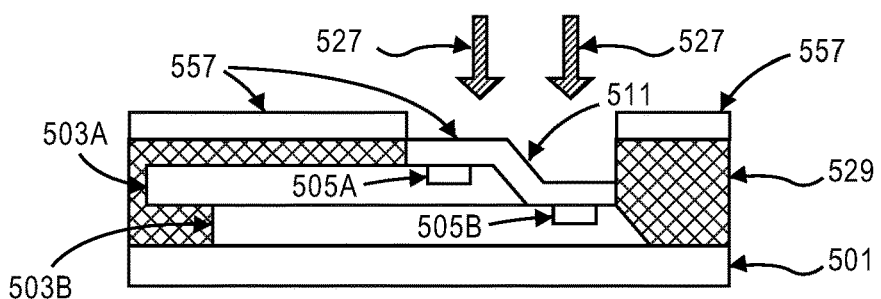
Figure 5E:
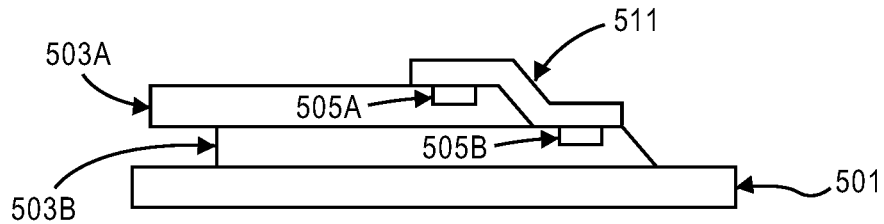
Figure 5F:
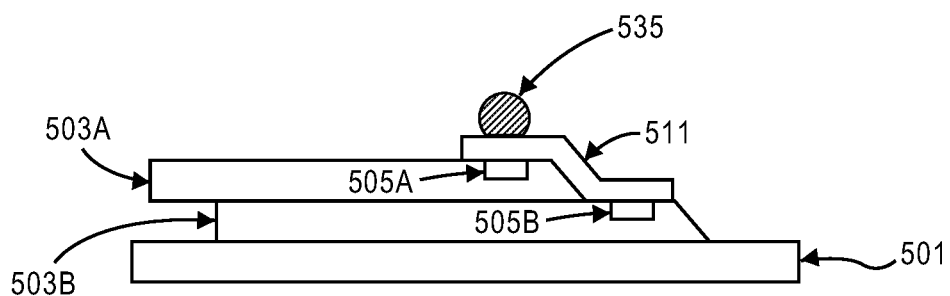
Figure 5G:
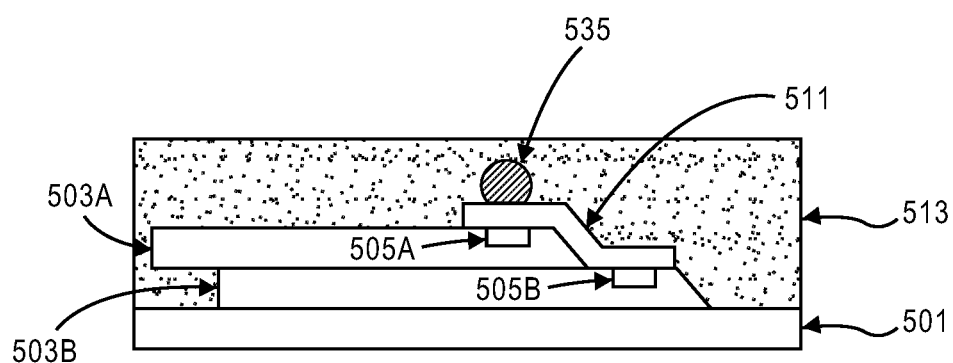
Figure 5H:
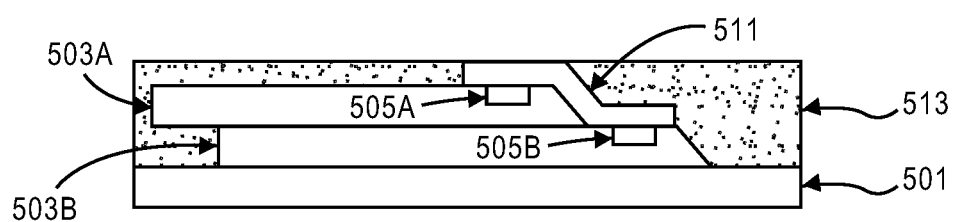

With regard now to FIG. 5F, a bump 535 is bonded onto a topmost surface of the interconnect structure 511. The bump 535 may be formed from copper, aluminum, gold, silver, or any other suitable material or combination of suitable materials known in the art. The bump 535 may be a material that is suitable as an indicator for when the top surface of the interconnect structure 511 is exposed. Particularly, the bump 535 may be a material that is different than the material used for the interconnect structure 511. Next, in FIG. 5G, a molding compound 513 is used to encapsulate the bump 535, the dies 503A-B, and the interconnect structure 511. Next, in FIG. 5H, a grinding technique (e.g., CMP, etc.) is used to remove top portions of the molding compound 513 and the bump 535 until a surface of the interconnect structure 511 is exposed. Particularly, when the bump 535 begins to be exposed the amount of grinding remaining to expose the interconnect structure is known. Accordingly, bump 535 may be used to prevent the grinding technique from removing a portion of the interconnect structure 511.

Figure 5I:
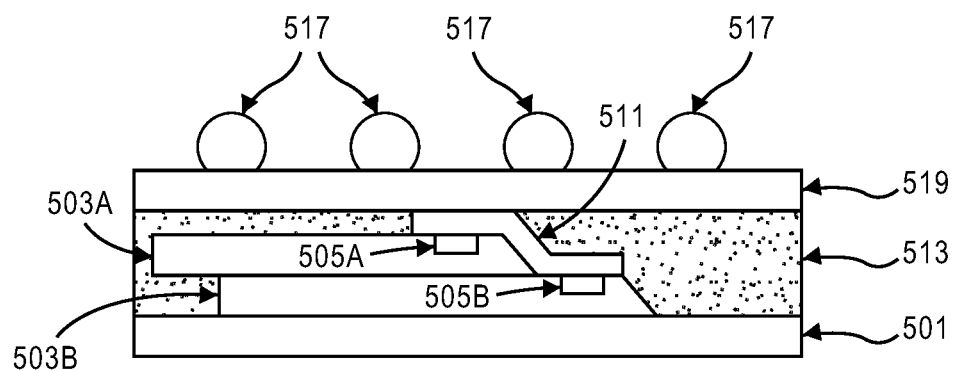

Moving on to FIG. 5I, an RDL 519 may be formed on the molding compound 513 and on the exposed surface of the interconnect structure 511. Any suitable technique known in the art for forming an RDL may be used. The RDL 519 may be similar to or the same as the RDL 307 described above in connection with FIG. 3. Additionally, a plurality of solder bumps 517 (or any other interconnect architecture) may be formed on the RDL 519. The solder bumps 517 may be similar to or the same as the solder bumps 309 described above in connection with FIG. 3.

Figure 5J:
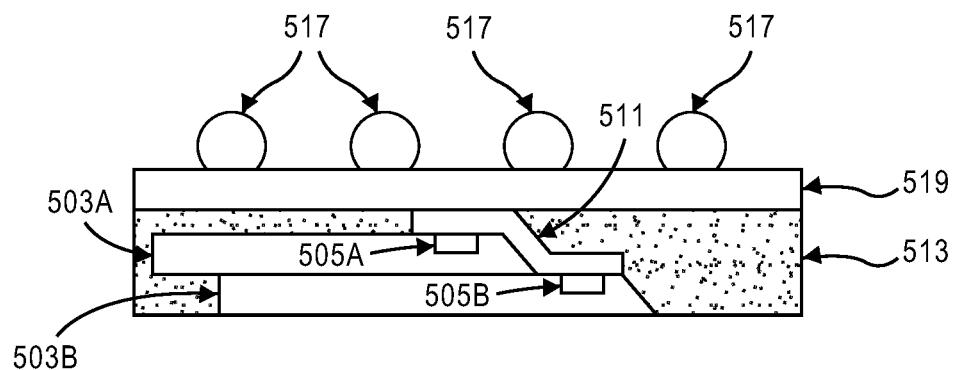

With regard now to FIG. 5J, a semiconductor package 500 is shown. The package 500 is formed after removal of the carrier 501 from the bottom surfaces of the die 505B and the molding compound 513. The package 500 can be similar to or the same as the package 300 described above in connection with FIG. 3.

Figure 6:
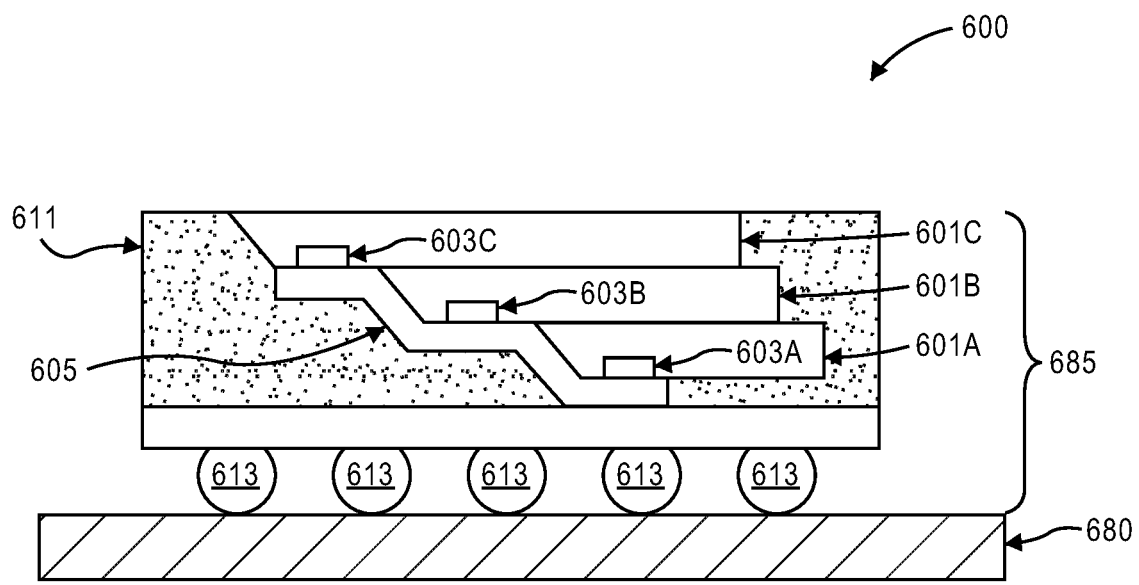
FIG. 6 illustrates a cross-sectional side view of a packaged system that includes a semiconductor package and a board (e.g., a printed circuit board, etc.), according to one embodiment.

FIG. 6 illustrates a cross-sectional side view of a packaged system 600 that includes a semiconductor package 685 and a board 680 (e.g., a printed circuit board, etc.), according to one embodiment. In an embodiment, the packaged system 600 may include a semiconductor package 685. The package 685 comprises components that are similar to or the same as the components described above in connection with the package 300 shown in FIG. 3. For brevity, these components are not described again.

In an embodiment, the packaged system 600 may include the semiconductor package 685 electrically coupled to a board 680 (e.g., a PCB, etc.) with solder bumps 613 and any other suitable interconnect architecture, such as wire bonding, ball grid array, pin grid array, land grid array, or the like.

Figure 7:
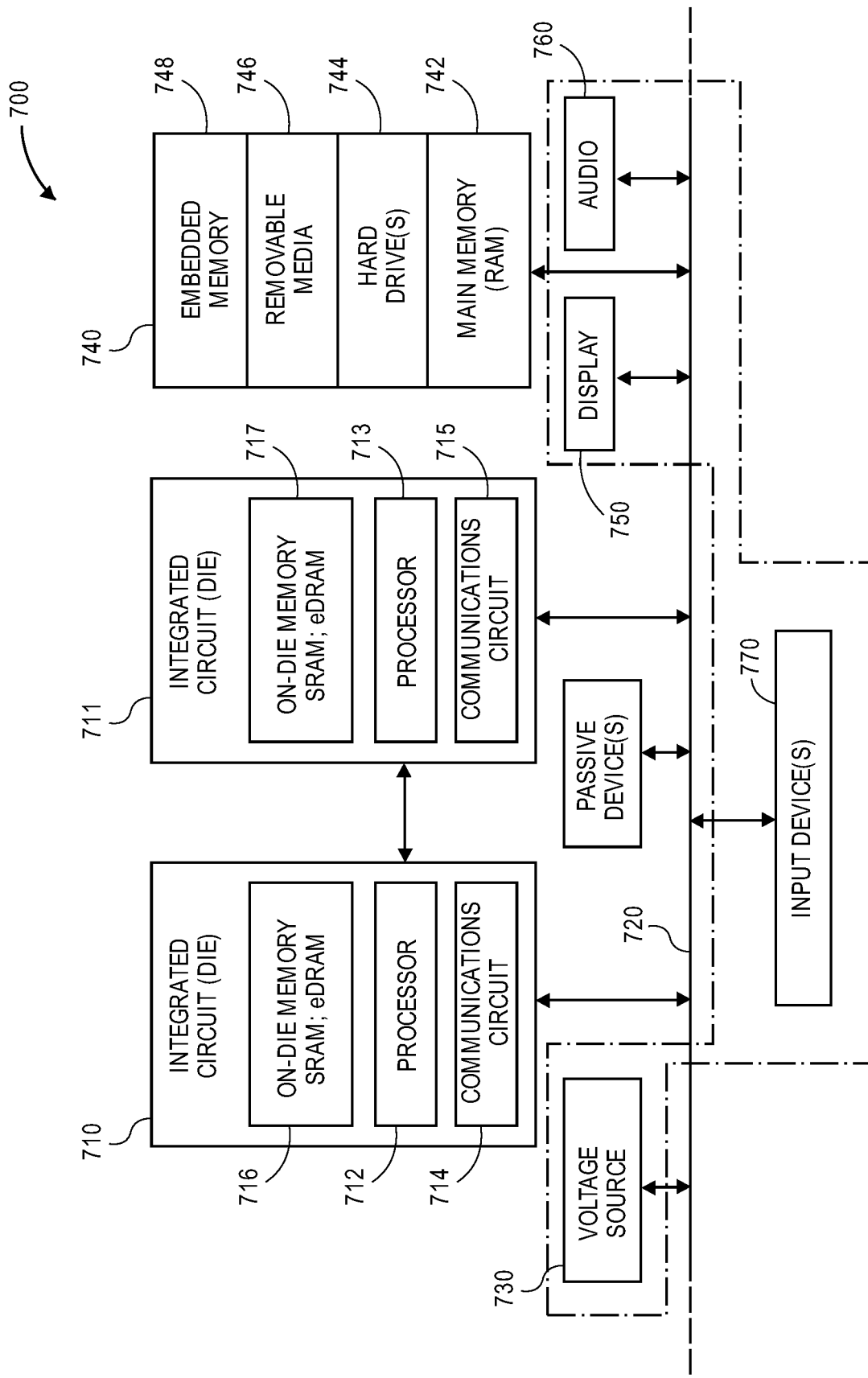
FIG. 7 illustrates a schematic of computer system, according to an embodiment.

FIG. 7 illustrates a schematic of computer system 700 according to an embodiment. The computer system 700 (also referred to as an electronic system 700) can include a semiconductor package comprising an interconnect structure formed using PVD in accord with any of the embodiments and their equivalents as set forth in this disclosure. The computer system 700 may be a mobile device, a netbook computer, a wireless smart phone, a desktop computer, a hand-held reader, a server system, a supercomputer, or a high-performance computing system.

The system 700 can be a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In one embodiment, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712. As used herein, the processor 712 may mean any type of circuit such as, but not limited to, a microprocessor, a microcontroller, a graphics processor, a digital signal processor, or another processor. In an embodiment, the processor 712 includes, or is coupled with, a semiconductor package comprising an interconnect structure formed using PVD in accordance with any of the embodiments and their equivalents, as described in the foregoing specification. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM). In one embodiment, the on-die memory 716 may be packaged with a process in accordance with any of the embodiments and their equivalents, as described in the foregoing specification.

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory 740 that may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750 and an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

At least one of the integrated circuits 710 or 711 can be implemented in a number of different embodiments, including a semiconductor package comprising an interconnect structure formed using PVD as described herein, an electronic system, a computer system, one or more methods of fabricating an integrated circuit, and one or more methods of fabricating a semiconductor package comprising an interconnect structure formed using PVD, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising an interconnect structure formed using PVD in accordance with any of the disclosed embodiments as set forth herein and their art-recognized equivalents. A foundation substrate may be included, as represented by the dashed line of FIG. 7. Passive devices may also be included, as is also depicted in FIG. 7.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of fabricating semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing from the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein include a semiconductor package, comprising: a die stack comprising a first die and a second die, wherein each of the first and second dies in the die stack comprises: a first surface; a second surface opposite the first surface; sidewall surfaces coupling the first surface to the second surface; and a pad on the first surface; and an interconnect structure positioned on the first surfaces and at least one of the sidewalls, wherein the first die comprises a sidewall surface with a sloped profile, wherein the interconnect structure is positioned on the sidewall surface with the sloped profile, and wherein the interconnect structure electrically couples the pad on each of the first and second dies to each other.

Additional embodiments include a semiconductor package, further comprising a molding compound encapsulating the die stack and the interconnect structure.

Additional embodiments include a semiconductor package, wherein a top surface of the interconnect structure is exposed.

Additional embodiments include a semiconductor package, further comprising: a redistribution layer (RDL) on the molding compound and the top surface of the interconnect structure, wherein the interconnect structure couples the RDL to the pads.

Additional embodiments include a semiconductor package, further comprising a plurality of interconnects on the RDL.

Additional embodiments include a semiconductor package, wherein the first die is offset from the second die.

Additional embodiments include a semiconductor package, wherein the interconnect structure is a single structure that conforms to: the first surface of the first die, the sidewall surface of the first die with the sloped profile, and the first surface of the second die.

Additional embodiments include a semiconductor package, wherein a thickness of the interconnect structure ranges from 0.5 µm to 5.0 µm.

Embodiments described herein include a method of forming a semiconductor package, comprising: disposing a die stack comprising a plurality of dies on a carrier, wherein each die in the die stack comprises: a first surface; a second surface opposite the first surface; sidewall surfaces coupling the first surface to the second surface, wherein at least one sidewall surface of each die comprises a sloped profile; and a pad on the first surface; fabricating an interconnect structure on the first surfaces and at least one of the sidewalls with the sloped profile, wherein the interconnect structure electrically couples each of the pads of the plurality of dies to each other; encapsulating the die stack and the interconnect structure in a molding compound, wherein a top surface of the interconnect structure is exposed; forming a redistribution layer (RDL) on the molding compound and the top surface of the interconnect structure, the interconnect structure coupling the RDL to each of the pads of the plurality of dies; and forming solder bumps on the RDL.

Additional embodiments include a method, wherein fabricating the interconnect structure comprises bonding a metallic structure to the top surface of the interconnect structure, wherein the metallic structure is formed from copper, gold, aluminum, silver, or a combination thereof.

Additional embodiments include a method, further comprising: grinding the molding compound and the metallic structure to expose the top surface of the interconnect structure.

Additional embodiments include a method, further comprising detaching the carrier.

Additional embodiments include a method, wherein each of the dies in the die stack is singulated from a wafer using a saw blade that has a V-shaped profile.

Additional embodiments include a method, wherein disposing the die stack comprising the plurality of dies on the carrier comprises transferring the singulated dies from the wafer onto the carrier.

Embodiments described herein include a die, comprising: a first surface; a second surface opposite the first surface; sidewall surfaces coupling the first surface to the second surface, wherein at least one sidewall surface has a sloped profile; and a pad on the first surface.

Additional embodiments include a die, wherein the at least one sidewall surface having the sloped profile is coupled to the second surface at an angle that ranges from 30 degrees to 60 degrees.

Additional embodiments include a die, wherein a die attach film (DAF) is under the die, the DAF having at least one sidewall with a sloped profile that matches the sloped profile of the at least one sidewall surface.

Embodiments described include a packaged system, comprising: a semiconductor package on a printed circuit board, the semiconductor package comprising: a die stack comprising a first die and a second die, wherein each of the first and second dies in the die stack comprises: a first surface; a second surface opposite the first surface; sidewall surfaces coupling the first surface to the second surface; and a pad on the first surface; and an interconnect structure positioned on the first surfaces and at least one of the sidewalls, wherein the first die comprises a sidewall surface with a sloped profile, wherein the interconnect structure is positioned on the sidewall surface with the sloped profile, and wherein the interconnect structure electrically couples the pad on each of the first and second dies to each other.

Additional embodiments include a packaged system, further comprising a molding compound encapsulating the die stack and the interconnect structure.

Additional embodiments include a packaged system, wherein a top surface of the interconnect structure is exposed.

Additional embodiments include a packaged system, further comprising: a redistribution layer (RDL) on the molding compound and the top surface of the interconnect structure, wherein the interconnect structure couples the RDL to the pads.

Additional embodiments include a packaged system, further comprising a plurality of solder bumps on the RDL.

Additional embodiments include a packaged system, wherein the first die is offset from the second die.

Additional embodiments include a packaged system, wherein the interconnect structure is a single structure that conforms to: the first surface of the first die, the sidewall surface of the first die with the sloped profile, and the first surface of the second die.

Additional embodiments include a packaged system, wherein a thickness of the interconnect structure ranges from 0.5 µm to 5.0 µm.

The invention claimed is:

1. A semiconductor package, comprising:
a die stack comprising a first die and a second die, wherein each of the first and second dies in the die stack comprises:
a first surface;
a second surface opposite the first surface;
sidewall surfaces coupling the first surface to the second surface; and
a pad on the first surface; and
an interconnect structure, wherein the first die comprises a sidewall surface with a sloped profile, and the first die comprises a vertical sidewall surface laterally opposite to the sidewall surface with the sloped profile, wherein the interconnect structure is continuous from a top surface of the pad on the first surface of the first die, along the sidewall surface with the sloped profile of the first die, and to a top surface of the pad on the first surface of the second die, and wherein the interconnect structure electrically couples the pad on each of the first and second dies to each other.

2. The semiconductor package of claim 1, further comprising a molding compound encapsulating the die stack and the interconnect structure.

3. The semiconductor package of claim 2, wherein a top surface of the interconnect structure is exposed.

4. The semiconductor package of claim 3, further comprising:
a redistribution layer (RDL) on the molding compound and the top surface of the interconnect structure, wherein the interconnect structure couples the RDL to the pads.

5. The semiconductor package of claim 4, further comprising a plurality of interconnects on the RDL.

6. The semiconductor package of claim 1, wherein the first die is offset from the second die.

7. The semiconductor package of claim 6, wherein the interconnect structure is a single structure that conforms to:
the first surface of the first die,
the sidewall surface of the first die with the sloped profile, and
the first surface of the second die.

8. The semiconductor package of claim 1, wherein a thickness of the interconnect structure ranges from 0.5 µm to 5.0 µm.

9. A method of forming a semiconductor package, comprising:
disposing a die stack comprising a plurality of dies on a carrier, wherein each die in the die stack comprises:
a first surface;
a second surface opposite the first surface;
sidewall surfaces coupling the first surface to the second surface, wherein a sidewall surface of each die comprises a sloped profile, and a vertical sidewall surface is laterally opposite to the sidewall surface with the sloped profile; and
a pad on the first surface;
fabricating an interconnect structure continuous from a top surface of the pad on the first surface of a first die, along the sidewall surface with the sloped profile of the first die, and to a top surface of the pad on the first surface of a second die, wherein the interconnect structure electrically couples each of the pads of the first and second dies to each other;
encapsulating the die stack and the interconnect structure in a molding compound, wherein a top surface of the interconnect structure is exposed;
forming a redistribution layer (RDL) on the molding compound and the top surface of the interconnect structure, the interconnect structure coupling the RDL to each of the pads of the plurality of dies; and
forming solder bumps on the RDL.

10. The method of claim 9, wherein fabricating the interconnect structure comprises bonding a metallic structure to the top surface of the interconnect structure, wherein the metallic structure is formed from copper, gold, aluminum, silver, or a combination thereof.

11. The method of claim 10, further comprising:
grinding the molding compound and the metallic structure to expose the top surface of the interconnect structure.

12. The method of claim 9, further comprising detaching the carrier.

13. The method of claim 9, wherein each of the dies in the die stack is singulated from a wafer using a saw blade that has a V-shaped profile.

14. The method of claim 13, wherein disposing the die stack comprising the plurality of dies on the carrier comprises transferring the singulated dies from the wafer onto the carrier.

15. A packaged system, comprising:
a semiconductor package on a printed circuit board, the semiconductor package comprising:
a die stack comprising a first die and a second die, wherein each of the first and second dies in the die stack comprises:
a first surface;
a second surface opposite the first surface;
sidewall surfaces coupling the first surface to the second surface; and
a pad on the first surface; and
an interconnect structure, wherein the first die comprises a sidewall surface with a sloped profile, and the first die comprises a vertical sidewall surface laterally opposite to the sidewall surface with the sloped profile, wherein the interconnect structure is continuous from a top surface of the pad on the first surface of the first die, along the sidewall surface with the sloped profile of the first die, and to a top surface of the pad on the first surface of the second die, and wherein the interconnect structure electrically couples the pad on each of the first and second dies to each other.

16. The packaged system of claim 15, further comprising a molding compound encapsulating the die stack and the interconnect structure.

17. The packaged system of claim 16, wherein a top surface of the interconnect structure is exposed.

18. The packaged system of claim 17, further comprising:
a redistribution layer (RDL) on the molding compound and the top surface of the interconnect structure, wherein the interconnect structure couples the RDL to the pads.

19. The packaged system of claim 18, further comprising a plurality of solder bumps on the RDL.

20. The packaged system of claim 16, wherein the first die is offset from the second die.

21. The packaged system of claim 20, wherein the interconnect structure is a single structure that conforms to:
the first surface of the first die,
the sidewall surface of the first die with the sloped profile, and
the first surface of the second die.

22. The packaged system of claim 21, wherein a thickness of the interconnect structure ranges from 0.5 μm to 5.0 μm.

* * * * *